(12) United States Patent
Tamura et al.

(10) Patent No.: US 11,150,274 B2
(45) Date of Patent: Oct. 19, 2021

(54) CURRENT SENSOR

(71) Applicant: Alps Alpine Co., Ltd., Tokyo (JP)

(72) Inventors: Manabu Tamura, Miyagi-ken (JP);
Minoru Abe, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/899,879

(22) Filed: Jun. 12, 2020

(65) Prior Publication Data
US 2020/0309822 A1 Oct. 1, 2020

Related U.S. Application Data

(63) Continuation of application No. PCT/JP2018/045571, filed on Dec. 11, 2018.

(30) Foreign Application Priority Data

Dec. 13, 2017 (JP) .............................. JP2017-238462

(51) Int. Cl.
*G01R 15/20* (2006.01)
*G01R 15/18* (2006.01)
*G01R 19/00* (2006.01)

(52) U.S. Cl.
CPC ......... *G01R 15/18* (2013.01); *G01R 19/0092* (2013.01)

(58) Field of Classification Search
CPC ............ G01R 15/207; G01R 19/0092; G01R 15/202; G01R 15/205; G01R 15/20; H02M 7/003
See application file for complete search history.

(56) References Cited

U.S. PATENT DOCUMENTS

| | | | | |
|---|---|---|---|---|
| 5,561,366 A | * | 10/1996 | Takahashi | G01R 15/205 324/117 R |
| 9,417,269 B2 | * | 8/2016 | Sakai | G01R 19/0092 |
| 9,465,054 B2 | * | 10/2016 | Sakamoto | G01R 15/207 |
| 10,088,505 B2 | * | 10/2018 | Okuyama | G01R 33/093 |
| 10,267,826 B2 | | 4/2019 | Harada | |

(Continued)

FOREIGN PATENT DOCUMENTS

| | | |
|---|---|---|
| EP | 3176590 | 6/2017 |
| JP | 2006-252957 | 9/2006 |

(Continued)

OTHER PUBLICATIONS

International Search Report and Written Opinion from corresponding international application No. PCT/JP2018/045571, 8pgs, dated Feb. 26, 2019.

*Primary Examiner* — Alesa Allgood
(74) *Attorney, Agent, or Firm* — Crowell & Moring LLP

(57) ABSTRACT

A current sensor includes at least one bus bar through which a current to be measured flows and a casing integrated with part of the bus bar. A conductive portion is provided in the at least one bus bar, which is used to verify whether the current sensor functions normally. In the conductive portion, a front face of the bus bar is exposed from a casing main body to form an exposed face and a rear face of the bus bar opposite the exposed face is coated with synthetic resin to form coated face. Furthermore, the conductive portion has a trapezoidal shape in which the longer base is the exposed face and the shorter base is the coated face.

6 Claims, 6 Drawing Sheets

(56) References Cited

U.S. PATENT DOCUMENTS

| | | | | |
|---|---|---|---|---|
| 10,330,707 B2* | 6/2019 | Abe | ................ | G01R 15/205 |
| 2005/0161809 A1* | 7/2005 | Nakatsu | ............. | H02M 7/003 |
| | | | | 257/734 |
| 2007/0199926 A1 | 8/2007 | Watanabe | | |
| 2008/0186021 A1* | 8/2008 | Hashio | ............. | G01R 15/207 |
| | | | | 324/225 |
| 2013/0335076 A1* | 12/2013 | Sakamoto | ........... | G01R 15/207 |
| | | | | 324/244 |
| 2017/0285075 A1* | 10/2017 | Okuyama | ........... | G01R 15/205 |
| 2017/0285076 A1* | 10/2017 | Okuyama | ........... | G01R 33/025 |
| 2018/0038896 A1* | 2/2018 | Sakaguchi | ........ | G01R 33/0047 |

FOREIGN PATENT DOCUMENTS

| | | |
|---|---|---|
| JP | 2007-265962 | 10/2007 |
| JP | 2007-329035 | 12/2007 |
| JP | 2008-192680 | 8/2008 |
| JP | 2010-101751 | 5/2010 |
| JP | 2014-78408 | 5/2014 |
| JP | 2016-001168 | 1/2016 |
| JP | 2017-102022 | 6/2017 |
| JP | 2017-102024 | 6/2017 |

* cited by examiner

CURRENT SENSOR

CLAIM OF PRIORITY

This application is a Continuation of International Application No. PCT/JP2018/045571 filed on Dec. 11, 2018, which claims benefit of priority to Japanese Patent Application No. 2017-238462 filed on Dec. 13, 2017. The entire contents of each application noted above are hereby incorporated by reference.

BACKGROUND

1. Field of the Disclosure

The present invention relates to a current sensor that calculates a current value in accordance with a magnetic field generated by a current to be measured.

2. Description of the Related Art

Japanese Unexamined Patent Application Publication No. 2017-102022 describes a known current sensor that calculates a current value in accordance with a magnetic field generated by a current to be measured. The current sensor described in Japanese Unexamined Patent Application Publication No. 2017-102022 includes a bus bar through which a current to be measured flows, a magnetic sensor that measures an induction field generated by the current to be measured, and a casing that houses the magnetic sensor and that is integrated with the bus bar. Both ends of the bus bar are exposed from a surface of the casing as terminals to be connected to another device such as a three-phase current motor.

A current sensor of this type is subjected to a performance check for checking whether the current sensor normally functions as specified in a product specification at a last stage of a manufacturing process. This performance check is performed through the terminals to be connected to the other device.

Specifically, a current probe for a performance check is pushed against part of a terminal and a test current (300 to 1000 A) flows through the bus bar, and then, a current value flowing through the bus bar is actually measured and whether a value similar to the test current is indicated is checked. Here, a current sensor that indicates a different value from the test current and fails to pass the check undergoes adjustment of circuitry and a software constant, and the performance check is performed again on this current sensor.

However, since the test current flowing through the bus bar is a large current, the current probe for a performance check is required to be pushed against part of the terminal of the bus bar with a strong force. Thus, it is unavoidable that a fine scratch is made on a surface of the terminal by a pushing force of the current probe.

In the current sensor of this type, terminals to which the other device is to be connected are roughly classified into the following two types. One of the two types is a type that is removably connected to a terminal of the other device similar to that of the current sensor described in Japanese Unexamined Patent Application Publication No. 2017-102022, that is, a crimp-type terminal fastened by a bolt or the like. Another type is a type that is not removable from the terminal of the other device, that is, a welding-type terminal connected by welding.

With the welding-type terminal, misalignment due to deformation of the terminal or damage to the surface causes poor welding. Thus, a current sensor with the welding-type terminal is required to be handled more carefully than with that of the type having a crimp-type terminal such as the current sensor described in Japanese Unexamined Patent Application Publication No. 2017-102022.

In method described above, in which the current probe is pushed against part of the terminal similarly to the method of related art, there is issue wherein ich deformation of or damage to the welding-type terminal may be caused even by a temporary connection.

SUMMARY

A current sensor includes at least one bus bar, a magnetic sensor, and a casing. The at least one bus bar has a pair of terminals to be connected to another device. The magnetic sensor is configured to detect an induction field generated by a current flowing through the at least one bus bar. The casing houses the magnetic sensor, is integrated with the at least one bus bar with the pair of terminals exposed, and is comprised of a synthetic resin. The at least one bus bar has a conductive portion for a performance check that includes an exposed face and a coated face. The exposed face is disposed such that at least part of a front face of the exposed face is exposed from the casing. The coated face is formed by coating with the casing at least part of a rear face opposite the exposed face. A length of the exposed face is greater than a length of the coated face in a sectional shape perpendicular to a current flowing direction, and edge faces that connect the exposed face and the coated face to each other such that each of the edge faces connects a corresponding one of ends of the exposed face and a corresponding one of ends of the coated face to each other form a reverse tapered shape in which a distance between the edge faces increases from the coated face toward the exposed face. The exposed face projects from a surface of the casing at a boundary between the conductive portion and the surface of the casing.

In the current sensor according to the present invention, the conductive portion for a performance check includes the exposed face and the coated face, and the current probe for a performance check can be pushed against this exposed face. In this case, even when the current probe is strongly pushed against the exposed face, this force can be received by the coated face. Accordingly, since the current probe can be pushed with a strong force, a correct performance check can be performed. In addition, deformation of or damage to the terminals can be prevented.

Furthermore, the exposed face projects from the surface of the casing at the boundary between the conductive portion and the surface of the casing. Thus, the current probe can be reliably brought into contact with the exposed face of the conductive portion.

DESCRIPTION OF THE EXEMPLARY EMBODIMENTS

Next, a current sensor that is an example of an embodiment of the present invention is described with reference to FIGS. 1 to 6. A current sensor 1 according to the present embodiment can be used for devices that require large current such as controllers used for, for example, hybrid vehicles and electric vehicles. In the description, a direction in which the current flows is defined as an extension direction (Y direction in FIG. 1), a direction in which bus bars are arranged is defined as a transverse direction (X direction in FIG. 1), and a direction perpendicular to the transverse direction when seen from the extension direction is defined as a longitudinal direction (Z direction in FIG. 1).

Figure 1:
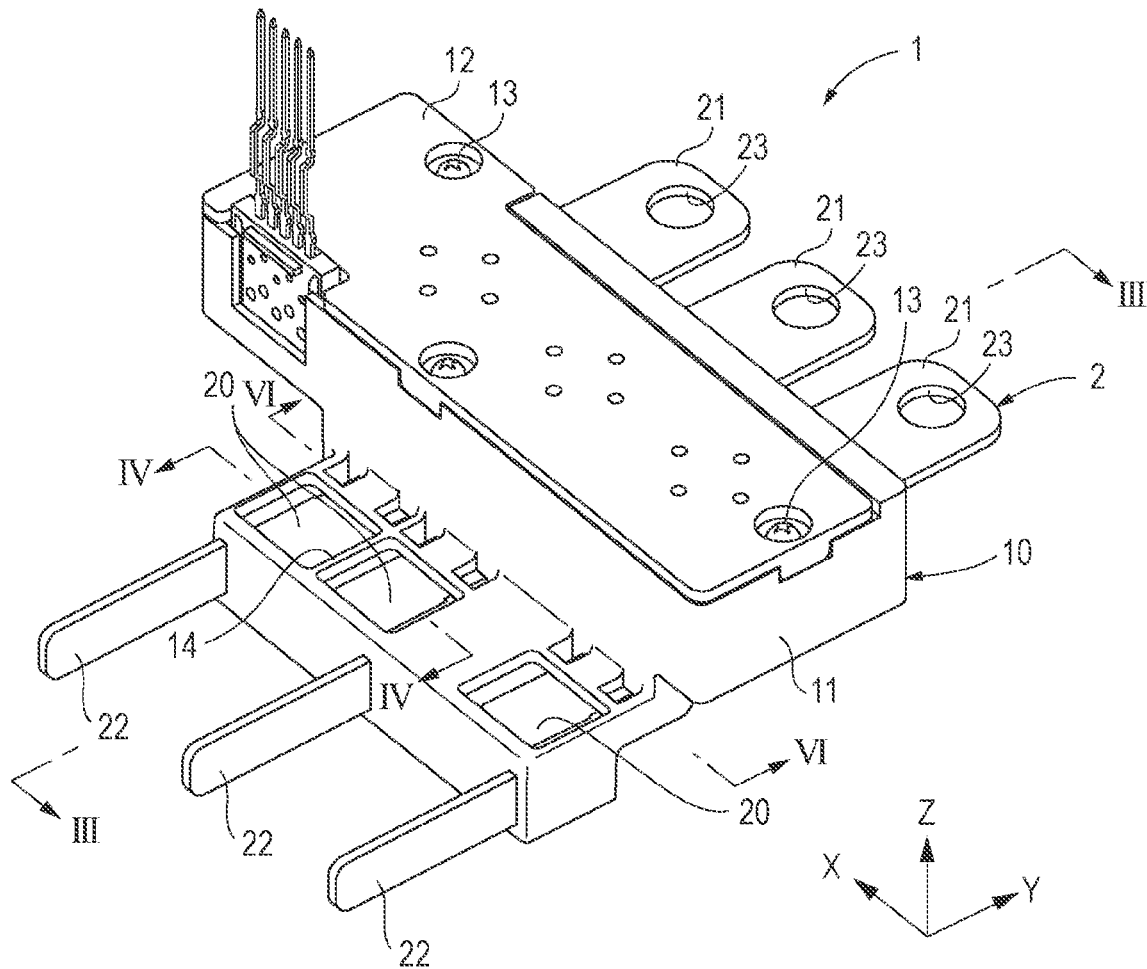
FIG. 1 is a perspective view illustrating the appearance of a current sensor that is an example of an embodiment according to the present invention.
Figure 2:
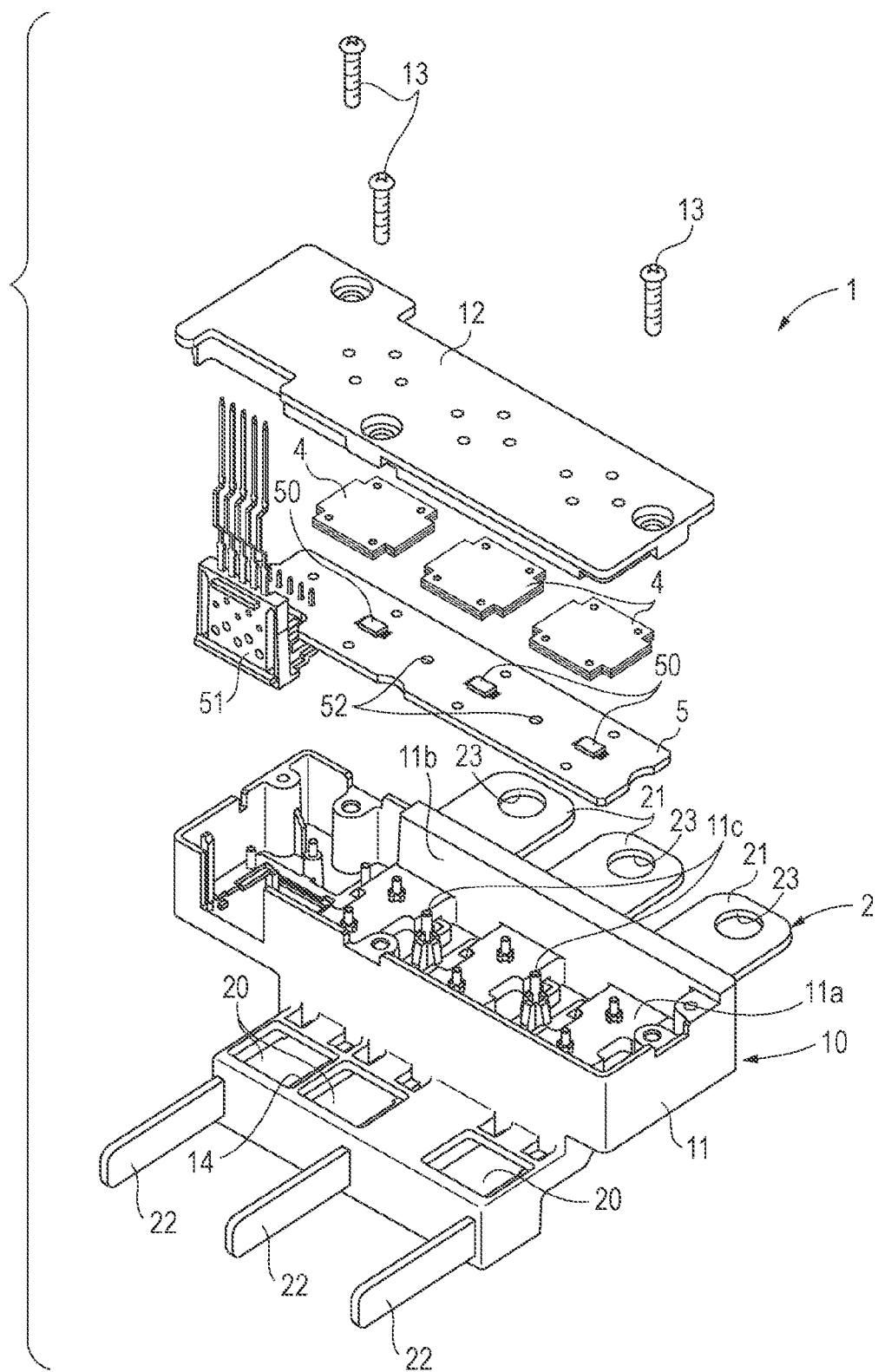
FIG. 2 is an explanatory view illustrating the current sensor illustrated in FIG. 1 with a lid removed.
Figure 3:
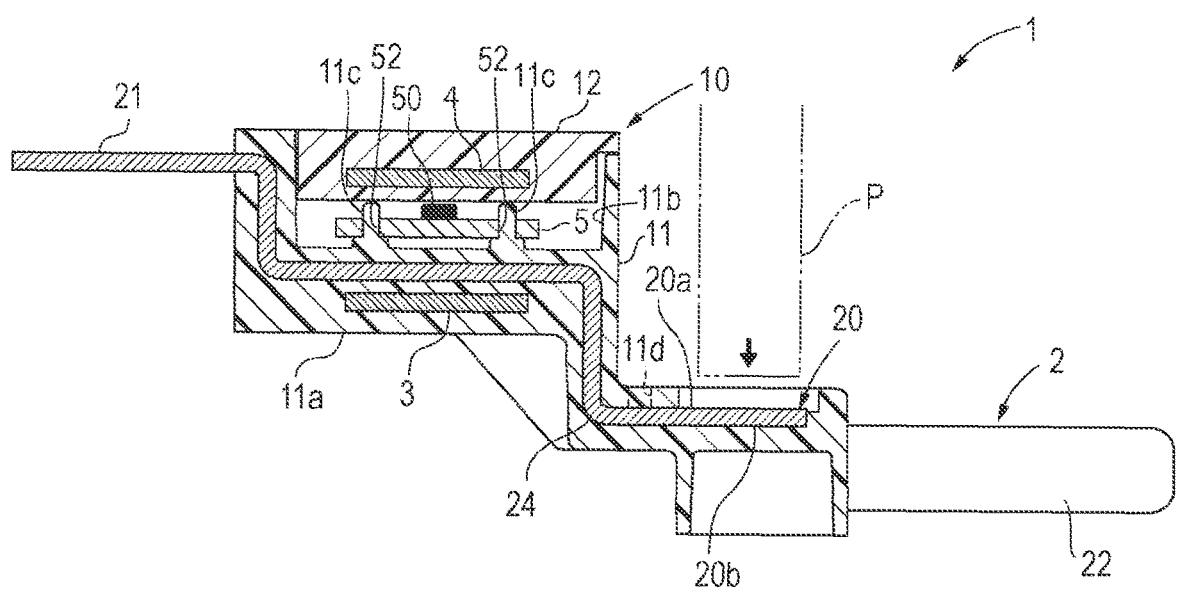
FIG. 3 is a sectional view taken along line III-III in FIG. 1.
Figure 4:
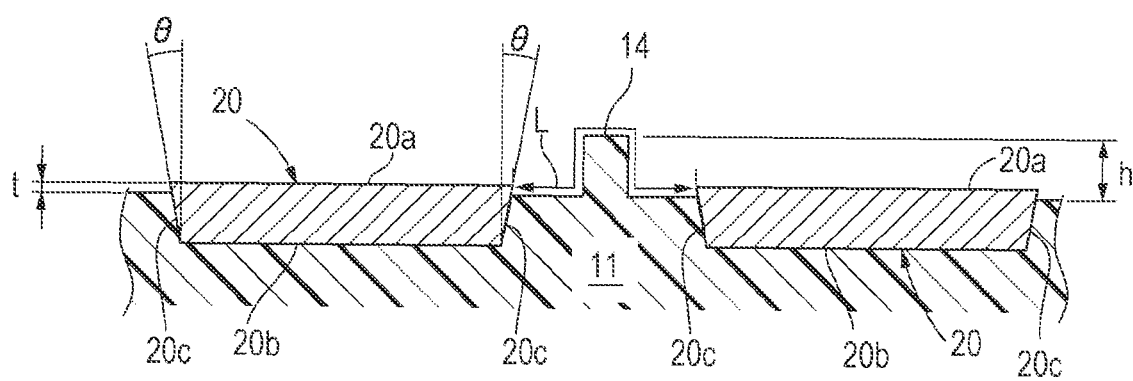
FIG. 4 is a sectional view taken along line IV-IV in FIG. 1.

FIG. 1 is a perspective view illustrating the appearance of the current sensor according to the embodiment. FIG. 2 is a perspective view illustrating a state of the current sensor in which a lid, lid magnetic shields, and a board are disengaged. FIG. 3 is a sectional view illustrating an inner structure of the current sensor taken along line III-III in FIG. 1. FIG. 4 is a sectional view illustrating a sectional shape of a conductive portion taken along line IV-IV in FIG. 1.

As illustrated in FIG. 1, the current sensor 1 according to the present embodiment includes three bus bars 2 through which a current to be measured flows and a casing 10 integrated with parts of the three bus bars 2. Conductive portions 20 for a performance check are provided in the casing 10. The conductive portions 20 are used to verify whether the current sensor 1 normally functions.

The bus bars 2 are each formed by, for example, punching a metal plate of copper, a copper alloy, or the like by pressing or the like, and then, bending the metal plate into a predetermined shape. As illustrated in FIGS. 1 and 2, a pair of terminals 21, 22 are formed at respective ends of the bus bar 2. Another device (not illustrated) is to be connected to the pair of terminals 21, 22. The terminals 21, 22 are exposed from a surface of the casing 10.

The terminal 21 being one of the pair of terminals 21, 22 is a crimp-type terminal to be removably connected to the other device and has a through hole 23 through which a bolt is to be inserted for fastening to the other device. The crimp-type terminals 21 are arranged in the transverse direction so as to be aligned with each other at front faces and rear faces (coplanar with each other).

Preferably, the terminal 22 being the other of the pair of terminals 21, 22 is the welding-type terminal 22 to be connected to the other device by welding. The welding-type terminals 22 are bent such that front faces and rear faces face each other (parallel to each other). The welding-type terminal 22 is arranged in the transverse direction.

As illustrated in FIG. 2, the casing 10 includes a box-shaped casing main body 11 having an open upper face and a lid 12 that covers the upper face of the casing main body 11. Both the casing main body 11 and the lid 12 are formed of insulative synthetic resin. As the synthetic resin, for example, resin having a good heat resistance such as polyphenylene sulfide (PPS) is used. Furthermore, for improvement of toughness, an elastomer or the like may be mixed.

As illustrated in FIG. 3, the bus bars 2 and main body-side magnetic shields 3 are secured at respective predetermined positions in a bottom portion 11a of the casing main body 11 by integral molding. Thus, the positional relationships between the bus bars 2 and the main body-side magnetic shields 3 are held, and accordingly, accuracy of the current sensor 1 is stabilized.

According to the present embodiment, the bus bars 2 and the main body-side magnetic shields 3 are disposed in an injection mold (not illustrated, similarly not illustrated hereinafter) in a state in which three bus bars 2 are disposed parallel to each other and arranged in the transverse direction as described above and the main body-side magnetic shields 3 are disposed at the positions facing rear faces of the respective bus bars 2. Then, the bus bars 2 and the main body-side magnetic shields 3 are integrated with synthetic resin injected around the bus bars 2 and the main body-side magnetic shields 3 by molding.

As illustrated in FIGS. 2 and 3, three magnetic sensors 50 and a single terminal unit 51 are mounted on a common circuit board 5 and housed in an interior 11b of the casing main body 11. The terminal unit 51 is connecting terminals through which signals of the magnetic sensors 50 are output to the outside. Furthermore, the circuit board 5 is positioned relative to and secured to the casing main body 11 when positioning pins 11c projecting from the bottom portion 11a of the casing main body 11 are inserted through positioning holes 52 of the circuit board 5.

The magnetic sensors 50 detect an induction fields generated by currents flowing through the bus bars 2. The magnetic sensors 50 are disposed at respective positions facing front faces of the respective bus bars 2. Furthermore, as the magnetic sensors 50, for example, magnetoresistance effect elements or Hall elements can be used.

The lid 12 is placed on the upper face of the casing main body 11 and secured to the casing main body 11 by securing screws 13. Lid magnetic shields 4 are also secured to the lid 12 by integral molding. The lid magnetic shields 4 are disposed at respective positions facing the front faces of the respective bus bars 2. In FIG. 2, the lid magnetic shields 4 are separated from the lid 12.

As illustrated in FIGS. 1 and 2, preferably, the conductive portions 20 are each provided at a position between a corresponding one of the welding-type terminals 22 and a position where an induction field is detected by a corresponding one of the magnetic sensors 50. When the conductive portion 20 for a performance check is independently provided other than the terminals 21, 22 to be connected to the other device as described above, unlike the related art, it is not required that a current probe P be directly pushed against the welding-type terminal 22. Accordingly, deformation of or damage to the terminal 22 due to pushing of the current probe P can be prevented.

Furthermore, as illustrated in FIG. 3, in the conductive portion 20, the front face of the bus bar 2 is exposed from the casing main body 11 to form an exposed face 20a. The exposed face 20a is a portion against which the current probe P for a performance check is pushed in the vertical direction. Furthermore, in the conductive portion 20, the rear face of the bus bar 2 opposite the exposed face 20a is coated with the synthetic resin to form a coated face 20b.

When the coated face 20b opposite the exposed face 20a is coated with the synthetic resin as described above, the coated face 20b can absorb a pushing force of the current probe P to be exerted on the exposed face 20a. Accordingly, since the current probe P can be strongly pushed, a correct performance check can be performed. In addition, deformation of or damage to the bus bar 2 due to the pushing force of the current probe P can be prevented.

As illustrated in FIG. 4, the exposed face 20a projects from a surface of the casing main body 11 at a boundary between the conductive portion 20 and the surface of the casing main body 11. Thus, the current probe P can be reliably brought into contact with the exposed face 20a of the conductive portion 20. According to the present embodiment, a projecting amount t of the exposed face 20a is set to 0.01 to 0.05 mm.

Preferably, according to the present embodiment, a resin wall portion 14 projecting from the surface of the casing main body 11 is formed between the conductive portions 20 adjacent to each other. Accordingly, the lengths of a creepage distance L and a spatial distance between the conductive portions 20 adjacent to each other along the resin wall portion 14 can be sufficiently obtained even when the linear distance between the adjacent conductive portions 20 is small. Thus, size reduction of the current sensor 1 with improved voltage resistance can be realized.

According to the present embodiment, a projecting amount h of the resin wall portion 14 is 1.8 mm, and the creepage distance L between the conductive portions 20 is 8.4 mm. However, this is not limiting. It is sufficient that the projecting amount h and the creepage distance L be such distances that electrical insulation against a value of a current flowing through the bus bar 2 can be obtained.

Furthermore, in the case where the linear distance between the adjacent conductive portions 20 is small, during an operation to push the current probe P against a target conductive portion 20, when the operation is incorrectly performed, the current probe P may be misaligned and brought into contact with a conductive portion 20 adjacent to the target conductive portions 20. However, with the resin wall portion 14, even when the current probe P is misaligned, the current probe P is brought into contact with the resin wall portion 14 and stopped. Thus, mistaken contact of the current probe P with the adjacent conductive portion 20 can be prevented.

As illustrated in FIGS. 1 and 2, according to the present embodiment, resin wall portions 14 preferably have a rectangular shape so as to surround the exposed faces 20a of the conductive portions 20. Thus, a range in which the current probe P can be brought into contact with the conductive portions 20 can be limited. Accordingly, the current probe P can be correctly positioned in a current flowing direction in the conductive portions 20, thereby accuracy of a performance check is improved.

Furthermore, as illustrated in FIG. 4, in the sectional shape taken along line IV-IV in FIG. 1, the conductive portion 20 has a trapezoidal shape in which the longer base is the exposed face 20a and the shorter base is the coated face 20b. The distance between a pair of edge faces 20c serving as the legs of this trapezoid both increases to form a reverse tapered shape from the coated face 20b toward the exposed face 20a, and the edge faces 20c are connected. According to the present embodiment, a taper angle θ of the edge faces 20c is set to 2 to 5°.

When a large current flows through the bus bar 2, the conductive portion 20 generates heat due to Joule heat and thermally expands. However, with the above-described structure, even when the conductive portion 20 thermally expands, the conductive portion 20 expands toward the exposed face side due to its sectional shape (trapezoidal shape). Thus, deformation of portions of the casing main body 11 around the conductive portion 20 can be reduced.

Figure 5A:
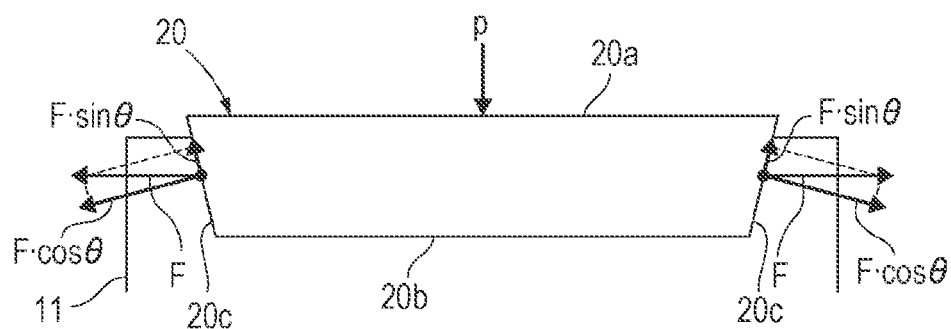
FIGS. 5A and 5B are explanatory views illustrating states in which a conductive portion have thermally expanded.
Figure 5B:
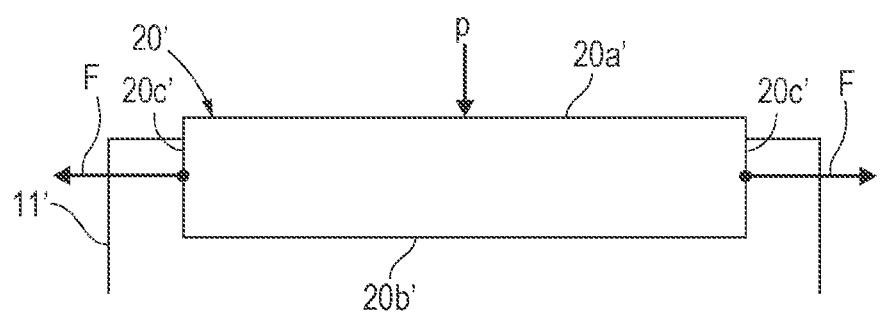

Next, a state in which the conductive portion 20 has thermally expanded is described with reference to FIGS. 5A and 5B. FIG. 5A is an explanatory view when the sectional shape of the conductive portion 20 is trapezoidal (present embodiment). FIG. 5B is an explanatory view when the sectional shape of the conductive portion 20 is rectangular (comparative example).

As illustrated in FIG. 5B, in the case where the sectional shape of a conductive portion 20' is rectangular, when a large current flows through a bus bar 2' and the conductive portion 20' thermally expands, expansion forces F are applied to edge faces 20c'. This may lead to deformation or cracking in portions of a casing main body 11' around the edge faces 20c'.

Furthermore, heat generation by the conductive portion 20' may soften the synthetic resin around the conductive portion 20'. Accordingly, the conductive portion 20' may sink into the casing main body 11' due to a pushing force p of the current probe P exerted on an exposed face 20a'.

Meanwhile, as illustrated in FIG. 5A, in the case where the sectional shape of the conductive portion 20 is trapezoidal, when a large current flows through the bus bar 2, and the conductive portion 20 thermally expands, expansion forces F are applied to the edge faces 20c. However, these expansion forces F are each divided by a corresponding one of the reverse tapered edge faces 20c into an expansion force F·sin θ in the edge face direction and an expansion force F·cos θ in a direction perpendicular to the edge face direction.

Of the expansion force F applied to the reverse tapered edge face 20c, the expansion force F·sin θ escapes in the edge face direction as described above. Thus, the expansion force F directly applied to the casing main body 11 is reduced to the expansion force F·cos θ, and accordingly, deformation of the portions of the casing main body 11 around the conductive portion 20 can be reduced. Furthermore, since the expansion force F·sin θ in the edge face direction becomes a repulsive force against the pushing force p of the current probe P, sinking of the conductive portion 20 into the casing main body 11 can be prevented.

Figure 6:
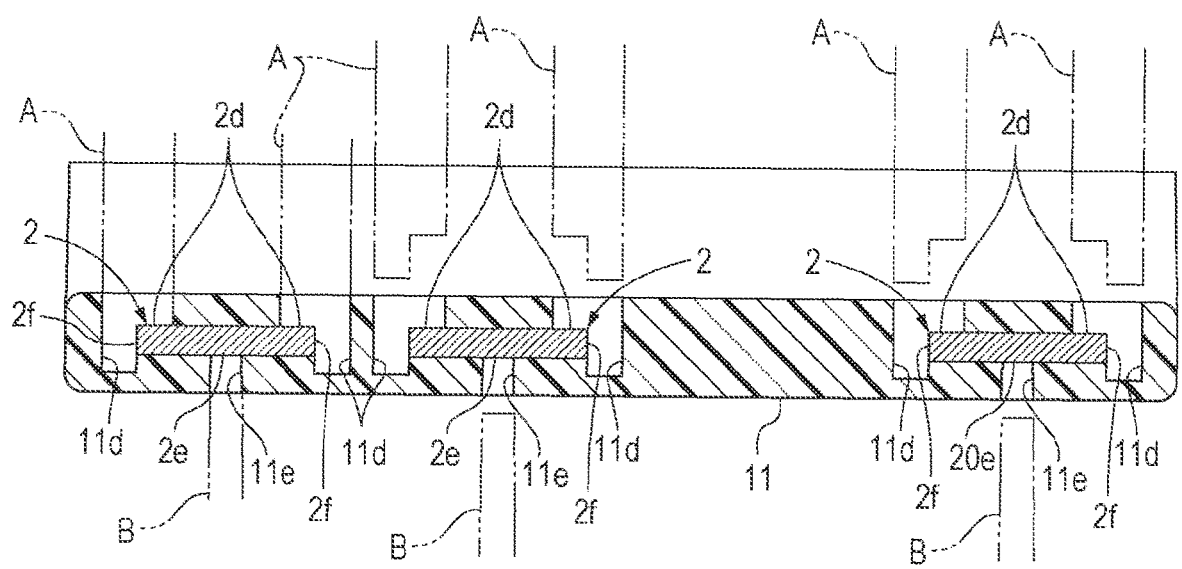
FIG. 6 is a sectional view taken along line VI-VI in FIG. 1.

FIG. 6 is a sectional view taken along line VI-VI in FIG. 1, illustrating positions in contact with positioning jigs used for positioning the bus bars 2 are in contact. The casing main body 11 has removal holes 11d and pin holes 11e. The removal holes 11d are formed by positioning tools A used for positioning the bus bars 2 in the longitudinal direction and the transverse direction in the mold (not illustrated) when the bus bars 2 and the casing main body 11 are integrated by molding. The pin holes 11e are formed by using pressing pins B used for positioning the bus bars 2 in the longitudinal direction in the mold (not illustrated) when the bus bars 2 and the casing main body 11 are integrated by molding.

According to the present embodiment, as illustrated in FIG. 6, the positioning tools A press side faces 2f and portions of the front faces 2d of the bus bars 2 loaded in the mold, thereby preventing misalignment of the bus bars 2 in the longitudinal direction and the transverse direction. The pressing pins B press portions of the rear faces 2e of the bus bars 2 loaded in the mold, thereby preventing misalignment of the bus bars 2 in the longitudinal direction.

Also according to the present embodiment, as illustrated in FIG. 3, the removal holes 11d formed by the positioning tools A are preferably provided between bent portions 24 of the bus bars 2 and the conductive portions 20. Thus, the positions of the conductive portions 20 that influence accuracy of a performance check in the transverse direction can be disposed at correct positions relative to the casing main body 11.

Although three bus bars 2 are disposed parallel to each other, arranged in the transverse direction and integrated with the casing main body 11 by molding according to the above-described present embodiment, a structure in which a single bus bar 2 is integrated with the casing main body 11 by molding may be used. The number of the bus bars 2 is not limited to three. Any number of the bus bars 2 may be used.

Although the exposed faces 20*a* of the conductive portions 20 are exposed from an upper face of the casing main body 11 in the longitudinal direction, this is not limiting. The exposed faces 20*a* may be exposed from a lower face in the longitudinal direction or side faces in the transverse direction of the casing main body 11. For example, two bus bars 2 may be arranged such that thickness side faces of the bus bars 2 disposed in the longitudinal direction so as to be parallel to each other. In this case, the exposed faces 20*a* are respectively exposed from the left and right side faces of the casing main body 11 in the transverse direction.

Although the rear face of the bus bar 2 is entirely coated with the synthetic resin so as to form the coated face 20*b*, this is not limiting. It is sufficient that a region in the coated face 20*b* in which the pushing force p of the current probe P can be absorbed be coated. For example, a central portion of the rear face of the bus bar 2 may be exposed. In this case, a region other than this central portion is coated so as to form the coated face 20*b*.

Furthermore, although the terminal 21 being one of the pair of terminals 21, 22 is the crimp-type terminal 21 and the terminal 22 being the other of the pair of terminals 21, 22 is the welding-type terminal 22, this is not limiting. All the terminals may be welding-type terminal or crimp-type terminals.

Furthermore, although the resin wall portion 14 has a rectangular shape so as to surround the exposed face 20*a* of the conductive portion 20, this is not limiting. The resin wall portion 14 may have a different shape such as a circular shape as long as the current probe P can be correctly positioned in the conductive portion 20.

What is claimed is:

1. A current sensor comprising:
   at least one bus bar that has a pair of terminals to be connected to another device;
   a magnetic sensor configured to detect an induction field generated by a current flowing through the at least one bus bar; and
   a casing that houses the magnetic sensor, that is integrated with the at least one bus bar with the pair of terminals exposed, and that is comprised of a synthetic resin, wherein
   the at least one bus bar has a conductive portion that includes an exposed face disposed such that at least part of a front face of the exposed face is exposed from the casing and a coated face formed by coating with the casing at least part of a rear face opposite the exposed face, wherein:
   a length of the exposed face is greater than a length of the coated face in a sectional shape perpendicular to a current flowing direction, and edge faces that connect the exposed face and the coated face to each other such that each of the edge faces connects a corresponding one of ends of the exposed face and a corresponding one of ends of the coated face to each other form a shape in which a distance between the edge faces increases from the coated face toward the exposed face, and
   the exposed face projects from a surface of the casing at a boundary between the conductive portion and the surface of the casing.

2. The current sensor according to claim 1, wherein:
   at least one of the pair of terminals is a welding-type terminal to be connected to the other device by welding, and
   the conductive portion is provided at a position between the welding-type terminal and a position where the induction field is to be detected by the magnetic sensor.

3. The current sensor according to claim 1, wherein:
   the at least one bus bar has a bent portion between the conductive portion and a position where the induction field is to be detected by the magnetic sensor, and
   the casing has a positioning-tool removal hole that allows part of one of the edge faces of the at least one bus bar and part of a front face of the at least one bus bar to be exposed to outside at a position between the bent portion of the at least one bus bar and the conductive portion of the at least one bus bar.

4. The current sensor according to claim 1, wherein the edge faces that connect the exposed face and the coated face to each other such that each of the edge faces connects a corresponding one of ends of the exposed face and a corresponding one of ends of the coated face to each other comprise a reverse tapered a shape.

5. The current sensor according to claim 1, wherein:
   the current sensor comprises a plurality of bus bars disposed in the current flowing direction so as to be parallel to each other, and
   the casing includes at least one resin wall portion that is disposed between the conductive portions of the plurality of bus bars adjacent to each other and that projects further than the exposed face.

6. The current sensor according to claim 5, wherein the at least one resin wall portion includes a plurality of resin wall portions formed so as to surround the respective conductive portions.

* * * * *